(12) United States Patent
Yagoshi

(10) Patent No.: US 10,978,392 B2
(45) Date of Patent: Apr. 13, 2021

(54) ELECTRICAL CHIP AND OPTICAL MODULE

(71) Applicant: FUJITSU LIMITED, Kawasaki (JP)

(72) Inventor: Teruaki Yagoshi, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 16/941,605

(22) Filed: Jul. 29, 2020

(65) Prior Publication Data

US 2021/0066195 A1 Mar. 4, 2021

(30) Foreign Application Priority Data

Aug. 30, 2019 (JP) .............................. JP2019-158660

(51) Int. Cl.
*H01L 23/528* (2006.01)
*H04B 10/40* (2013.01)
*G02B 6/42* (2006.01)

(52) U.S. Cl.
CPC ........ *H01L 23/5286* (2013.01); *G02B 6/4246* (2013.01); *H04B 10/40* (2013.01)

(58) Field of Classification Search
CPC .... H01L 23/5286; G02B 6/4246; H04B 10/40
See application file for complete search history.

(56) References Cited

U.S. PATENT DOCUMENTS

| 5,608,262 A * | 3/1997 | Degani | H01L 23/13 257/723 |
| 5,946,477 A * | 8/1999 | Ito | G06F 30/39 716/123 |
| 7,631,285 B2 * | 12/2009 | Ishikawa | G06F 30/394 716/138 |
| 2013/0004120 A1 * | 1/2013 | Zbinden | G02B 6/4269 385/14 |

FOREIGN PATENT DOCUMENTS

JP H02-002122 A 1/1990
JP 2001-320137 A 11/2001

* cited by examiner

*Primary Examiner* — Peniel M Gumedzoe
(74) *Attorney, Agent, or Firm* — Fujitsu Patent Center

(57) ABSTRACT

An electrical chip includes a plurality of electrical signal processing circuits arranged side by side on a chip board, the electrical signal processing circuits that processes electrical signals transmitted to each of a plurality of lanes for each lane; and a power supply wiring network provided in an area overlapping with each of the plurality of electrical signal processing circuits and including wires formed into a mesh shape for supplying power to each of the plurality of electrical signal processing circuits, wherein the power supply wiring network includes a slit obtained by separating a part of the wires in each area corresponding to a boundary between the lanes.

6 Claims, 11 Drawing Sheets

ELECTRICAL CHIP AND OPTICAL MODULE

CROSS-REFERENCE TO RELATED APPLICATION

This application is based upon and claims the benefit of priority of the prior Japanese Patent Application No. 2019-158660, filed on Aug. 30, 2019, the entire contents of which are incorporated herein by reference.

FIELD

The disclosed technology relates to an electrical chip and an optical module.

BACKGROUND

The following technology is known as a technology of reducing switching noise generated by an internal element of a semiconductor integrated circuit. For example, a semiconductor integrated circuit device including a power supply wire that connects a plurality of power supply pads to each other in which a slit-shaped gap area is formed parallel to a longitudinal direction of the power supply wire between adjacent power supply pads in the power supply wiring area is known.

Furthermore, an electronic device equipped apparatus in which a plurality of electronic devices is mounted on a circuit board provided with a power supply pattern and a ground pattern is known. This electronic device equipped apparatus at least includes a groove for separating the power supply pattern and the ground pattern between each of the electronic devices on the circuit board, and is provided with a means of connecting the power supply pattern and the ground pattern in a high frequency manner around the groove. For example, Japanese Laid-open Patent Publication No. 2-2122, Japanese Laid-open Patent Publication No. 2001-320137 and the like are disclosed as the related arts.

SUMMARY

According to an aspect of the embodiments, an electrical chip includes a plurality of electrical signal processing circuits arranged side by side on a chip board, the electrical signal processing circuits that processes electrical signals transmitted to each of a plurality of lanes for each lane; and a power supply wiring network provided in an area overlapping with each of the plurality of electrical signal processing circuits and including wires formed into a mesh shape for supplying power to each of the plurality of electrical signal processing circuits, wherein the power supply wiring network includes a slit obtained by separating a part of the wires in each area corresponding to a boundary between the lanes.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 98 is a view illustrating a simulation model of the power supply wiring network in which the length of the slit is set to about 2 mm;

DESCRIPTION OF EMBODIMENTS

An optical module (optical transceiver) that performs signal transmission using a plurality of lanes (signal transmission paths) includes an electrical chip provided with a plurality of signal processing circuits that processes electrical signals transmitted to each lane for each lane. The electrical chip includes a power supply wire for supplying power to each of the signal processing circuits. In a case where this power supply wire is provided independently for each lane, for example, the number of terminals (bumps) connected to the power supply wire increases.

By sharing the power supply wire between the lanes, the number of terminals (bumps) connected to the power supply wire may be suppressed. However, in a case where the power supply wire is shared between the lanes, crosstalk occurs in which an operation of the signal processing circuit in a certain lane affects the signal processing circuit of another lane. Since the crosstalk deteriorates a signal transmission quality, it is preferable to suppress the crosstalk as much as possible.

In view of the above, it is desirable to suppress the crosstalk between the lanes in a case where the power supply wire is shared between the lanes.

Hereinafter, an embodiment of the disclosed technology is described with reference to the drawings. Note that, in each drawing, substantially the same or equivalent components or parts are assigned with the same reference sign.

Figure 1:
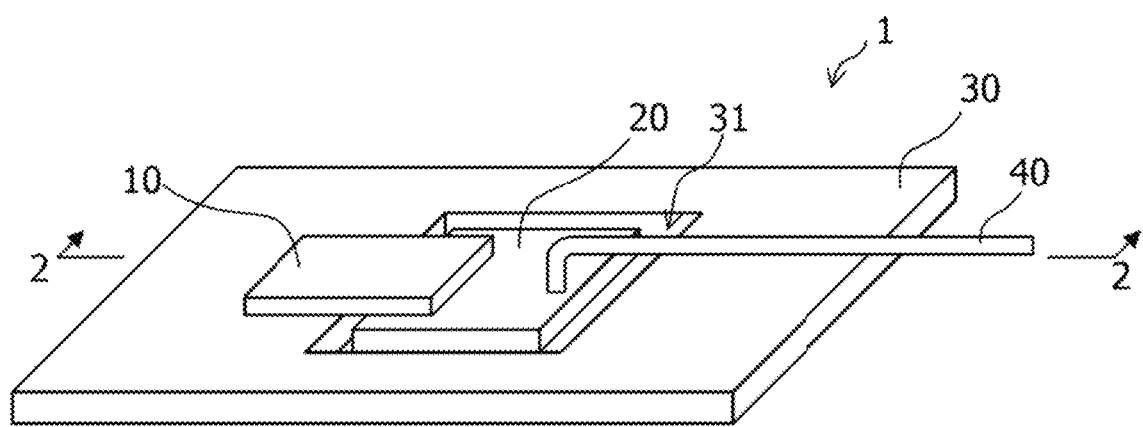
FIG. 1 is a perspective view illustrating an example of a configuration of an optical module according to an embodiment of the disclosed technology.
Figure 2:
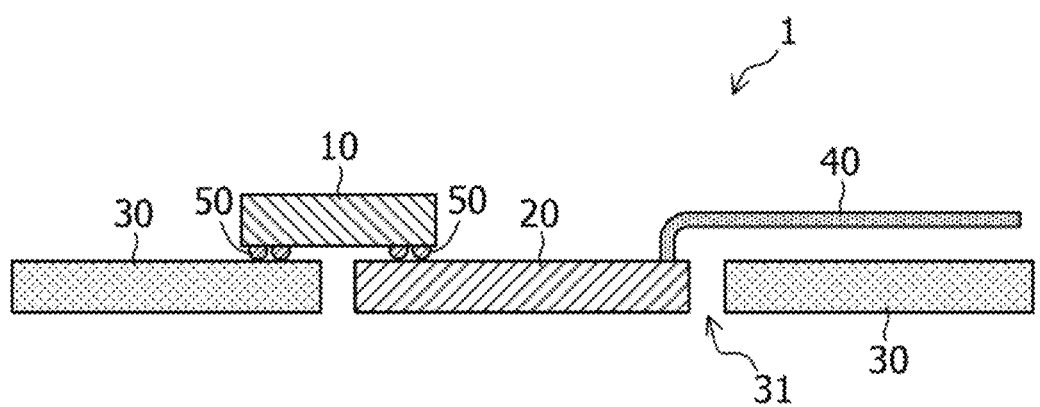
FIG. 2 is a cross-sectional view taken along line 2-2 in FIG. 1.

FIG. 1 is a perspective view illustrating an example of a configuration of an optical module (optical transceiver) 1 according to the embodiment of the disclosed technology. FIG. 2 is a cross-sectional view taken along line 2-2 in FIG. 1. The optical module 1 includes an electrical chip 10, an optical chip 20, and a module board 30.

The module board 30 is a printed wiring board obtained by forming a wire on an insulator such as a glass epoxy resin. The module board 30 is provided with an opening 31 in the center thereof, and the optical chip 20 is accommodated in the opening 31 so that a surface of the module board 30 and a surface of the optical chip 20 extend flush with each other.

The optical chip 20 is, for example, a device in which an optical waveguide formed by using a silicon photonics technology, a light receiving element, an optical modulation circuit, and a laser diode are made one package. An optical fiber 40 for transmitting an optical signal input to the optical chip 20 and an optical signal output from the optical chip 20 is connected to the optical chip 20.

The electrical chip 10 is a device provided with a circuit that processes an electrical signal corresponding to the optical signal input to and output from the optical chip 20. The electrical chip 10 is connected to the module board 30 via bumps 50 with one end protruding to the opening 31. Therefore, the circuit provided on the electrical chip 10 is electrically connected to the wire formed on the module board 30. A portion of the electrical chip 10 protruding to the opening 31 is connected to the optical chip 20 via the bumps 50. Therefore, the circuit provided on the electrical chip 10 is connected to the circuit provided on the optical chip 20. By configuring the electrical chip 10 to straddle the optical chip 20 and the module board 30 in this manner, a signal path may be shortened, so that high-speed signal transmission may be realized.

Figure 3:
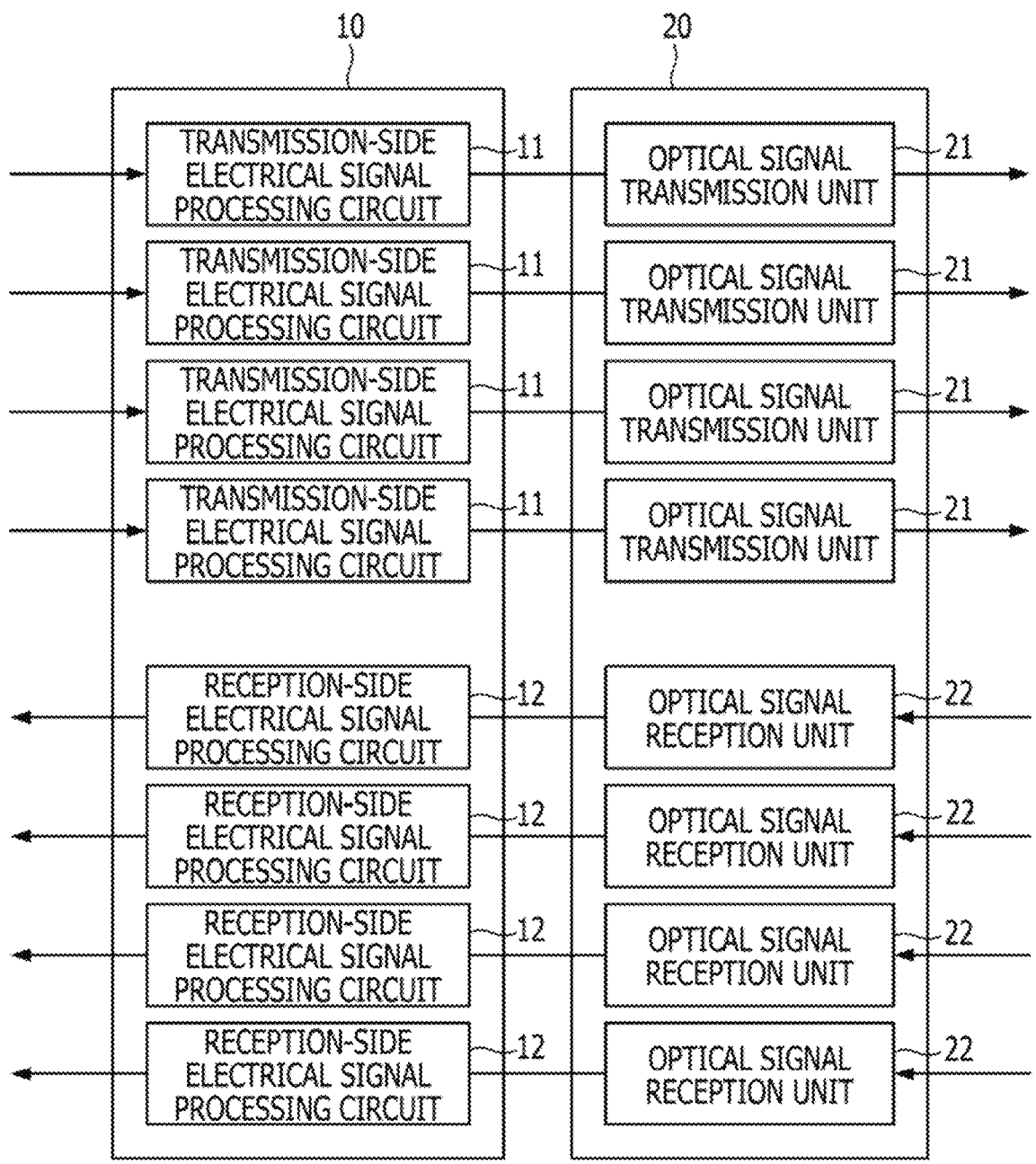
FIG. 3 is a functional block diagram illustrating an example of a functional configuration of an electrical chip and an optical chip according to the embodiment of the disclosed technology.

FIG. 3 is a functional block diagram illustrating an example of a functional configuration of the electrical chip 10 and the optical chip 20.

The electrical chip 10 includes a plurality of transmission-side electrical signal processing circuits 11 and a plurality of reception-side electrical signal processing circuits 12 that process the electrical signals transmitted to each of a plurality of lanes (signal transmission paths) for each lane. Note that, in this embodiment, a configuration including four lanes on each of a transmission side (TX side) and a reception side (RX) is illustrated, but the present invention is not limited to this, and the number of lanes may be appropriately increased or decreased.

Each of the transmission-side electrical signal processing circuits 11 may include a reception circuit that receives the electrical signal supplied via the module board 30, a dock data recovery (CDR) circuit that separates a dock and data included in the electrical signal, and an optical output driver that drives the optical chip 20 according to the data.

The reception-side electrical signal processing circuit 12 may include a transimpedance amplifier (TIA) that converts a photocurrent supplied from the light receiving element included in the optical chip 20 into a voltage signal, a CDR circuit that separates a dock and data included in the voltage signal, and an electrical output driver that drives a subsequent stage circuit according to the data.

The optical chip 20 processes the optical signal corresponding to the electrical signal processed by the electrical chip 10. Specifically, the optical chip 20 includes four optical signal transmission units 21 that process the electrical signals supplied from the respective transmission-side electrical signal processing circuits 11 for each lane and output the same as the optical signals. The optical signal transmission unit 21 may include a laser diode that generates signal light, and an optical modulation circuit that modulates the signal light on the basis of a drive signal supplied from the optical output driver included in the transmission-side electrical signal processing circuit 11.

Furthermore, the optical chip 20 includes four optical signal reception units 22 that receive optical signals externally supplied, process the same for each lane, and output the same as electrical signals. The optical signal reception unit 22 may include a light receiving element such as a photodiode that generates photocurrent according to the received optical signals.

Figure 4:
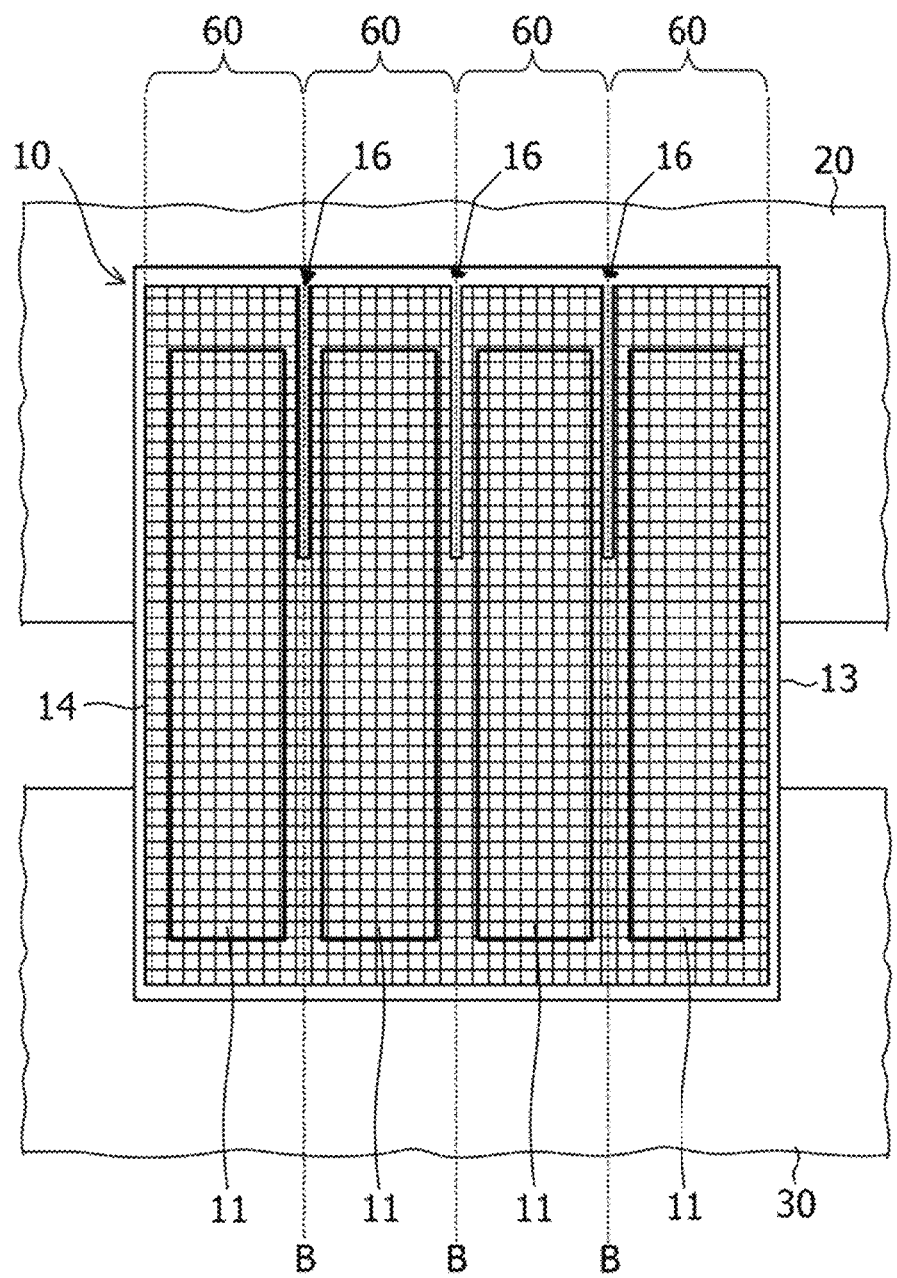
FIG. 4 is a plan view illustrating an example of a configuration of the optical chip according to the embodiment of the disclosed technology.

FIG. 4 is a plan view illustrating an example of a configuration of the electrical chip 10. Note that, although only the transmission side (TX side) is illustrated and the reception side (RX side) is not illustrated in FIG. 4, a configuration of the reception side is similar to that of the transmission side. For example, components on the reception side are arranged on the chip board 13 side by side with the components on the transmission side illustrated in FIG. 4.

As illustrated in FIG. 4, on the chip board 13 that forms the electrical chip 10, areas are allocated for four lanes 60 on the transmission side, respectively. Each of the transmission-side electrical signal processing circuits 11 is arranged on the chip board 13 in the area allocated for each lane 60. In other words, the four transmission-side electrical signal processing circuits 11 are arranged side by side on the chip board 13. The chip board 13 is connected to the module board 30 on one end side in a direction orthogonal to a direction in which each lane 60 is arranged, and is connected to the optical chip 20 on the other end side.

The electrical chip 10 includes a power supply wiring network 14 provided in an area overlapping with each of the transmission-side electrical signal processing circuits 11. The power supply wiring network 14 includes wires formed into a mesh shape for supplying power to each of the transmission-side electrical signal processing circuits 11.

Figure 5:
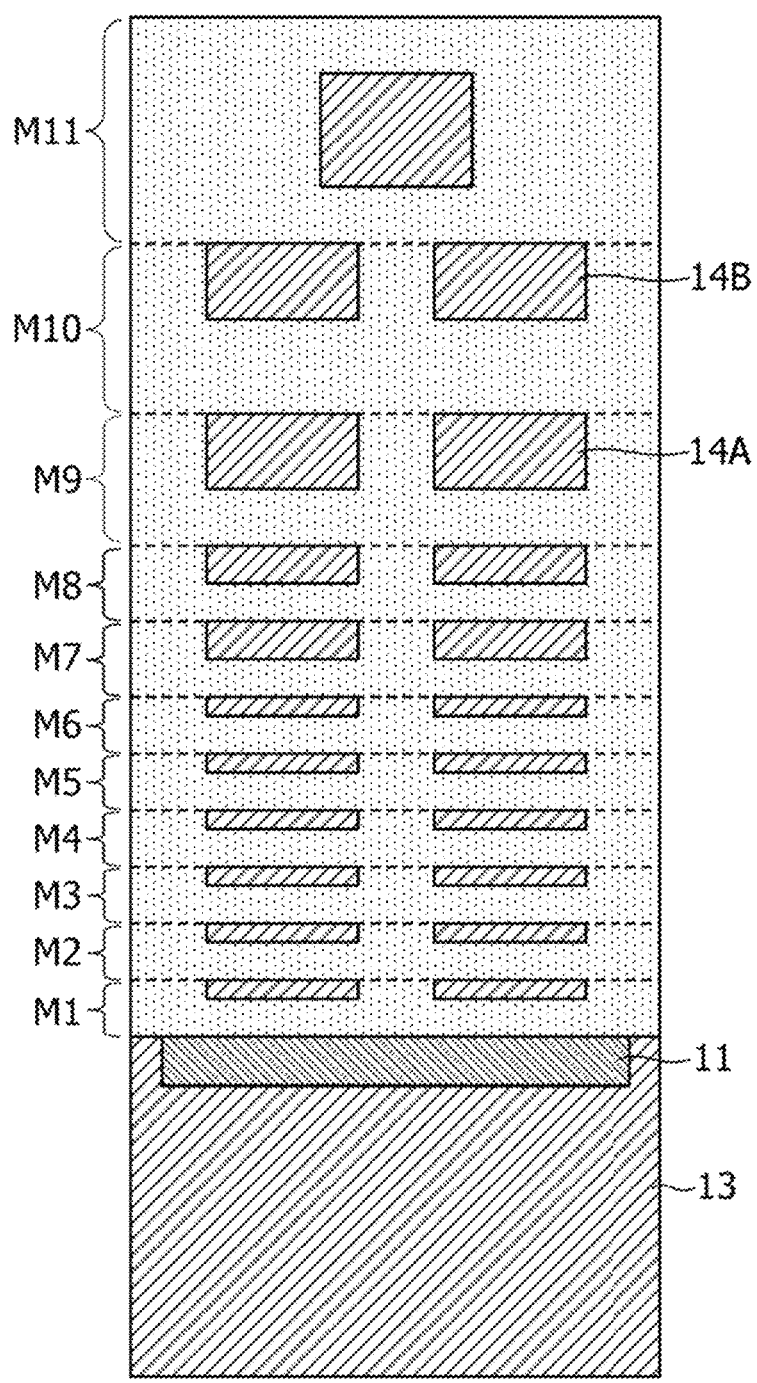
FIG. 5 is a view schematically illustrating an example of a cross-sectional structure of the electrical chip according to the embodiment of the disclosed technology.

FIG. 5 is a view schematically illustrating an example of a cross-sectional structure of the electrical chip 10. The electrical chip 10 includes the chip board 13 formed of a semiconductor such as silicon, and a plurality of wiring layers M1 to M11 provided on the chip board 13. Each of the transmission-side electrical signal processing circuits 11 is formed on the chip board 13 using a known semiconductor process. The plurality of wiring layers M1 to M11 is formed by alternately stacking an insulating film made of an insulator such as $SiO_2$ and a conductive film made of a conductor such as Al. The bumps 50 (refer to FIG. 2) are connected to the wiring layer M11, and the module board 30 and optical chip 20 are connected to the electrical chip 10 via the bumps 50. In this embodiment, the power supply wiring network 14 is formed of wires 14A and 14B formed in the wiring layers M9 and M10, respectively. Note that, the number of wiring layers and the wiring layers to which the wires 14A and 148 forming the power supply wiring network 14 belong, respectively, may be appropriately changed.

Figure 6:
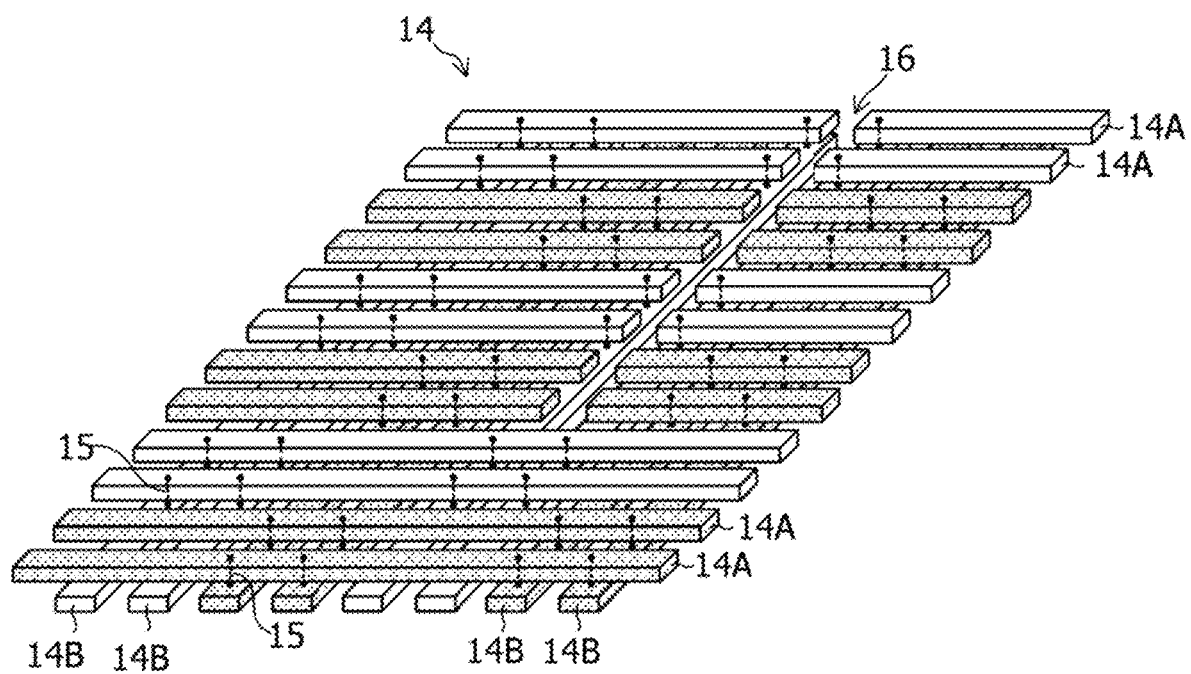
FIG. 6 is a perspective view illustrating an example of a configuration of a power supply wiring network according to the embodiment of the disclosed technology.

FIG. 6 is a perspective view illustrating an example of a configuration of the power supply wiring network 14. The power supply wiring network 14 includes a plurality of wires 14A parallel to each other provided in the wiring layer M9 and extending in a direction in which the transmission-side electrical signal processing circuits 11 are arranged (direction in which the lanes 60 are arranged). A ground potential is applied to a part of the plurality of wires 14A via the module board 30, and a power supply potential is applied to another part of the plurality of wires 14A via the module board 30. In FIG. 6, the wire 14A to which the power supply potential is applied is filled with dots, and the wire 14A to which the ground potential is applied is outlined.

The power supply wiring network 14 includes a plurality of wires 14B parallel to each other provided in the wiring layer M10 stacked on the wiring layer M9 and extending in a direction orthogonal to the direction in which the transmission-side electrical signal processing circuits 11 are arranged (direction in which the lanes 60 are arranged). A ground potential is applied to a part of the plurality of wires 14B via the module board 30, and a power supply potential is applied to another part of the plurality of wires 14B via the module board 30. In FIG. 6, the wire 14B to which the power supply potential is applied is filled with dots, and the wire 14B to which the ground potential is applied is outlined.

The wire 14A to which the ground potential is applied out of the wires 14A provided in the wiring layer M9 and the wire 14B to which the ground potential is applied out of the wires 14B provided in the wiring layer M10 are connected to each other via a via 15 at an intersection of the wires. Similarly, the wire 14A to which the power supply potential is applied out of the wires 14A provided in the wiring layer M9 and the wire 14B to which the power supply potential is applied out of the wires 14B provided in the wiring layer M10 are connected to each other via the via 15 at an intersection of the wires.

By forming the power supply wiring network 14 by a combination of the wires 14A and the wires 14B extending in the directions orthogonal to each other, the power supply wiring network 14 has a mesh shape. By providing the mesh-shaped power supply wiring network 14 in the area overlapping with each of the transmission-side electrical signal processing circuits 11 in this manner, wiring drop of a power supply voltage is suppressed, and it becomes possible to improve uniformity of the power supply voltage supplied to each of the transmission-side electrical signal processing circuits 11.

As illustrated in FIG. 4, the power supply wiring network 14 includes a slit 16 obtained by separating a part of the wires forming the power supply wiring network 14 in each area corresponding to a boundary B between the lanes 60. Each slit 16 extends along the boundary B between the lanes 60 from an end on an optical chip 20 side of the power supply wiring network 14. As illustrated in FIG. 6, the slit 16 is formed by separating a part of the plurality of wires 14A extending in the direction in which the lanes 60 are arranged in a portion across the boundary B between the lanes 60.

Figure 7A:
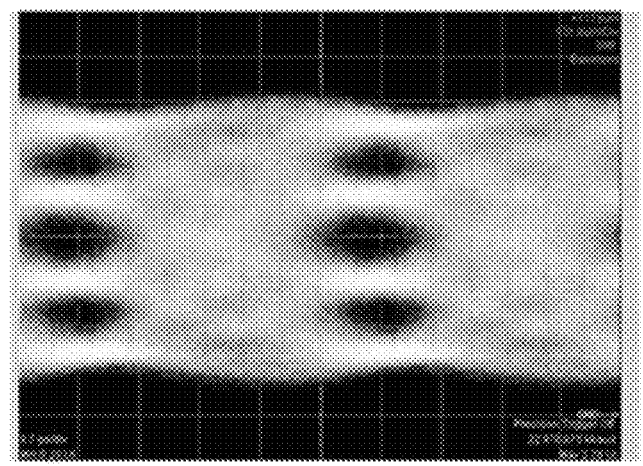
FIG. 7A is a view illustrating an example of an eye pattern of a signal output from a transmission-side electrical signal processing circuit according to the embodiment of the disclosed technology.
Figure 7B:
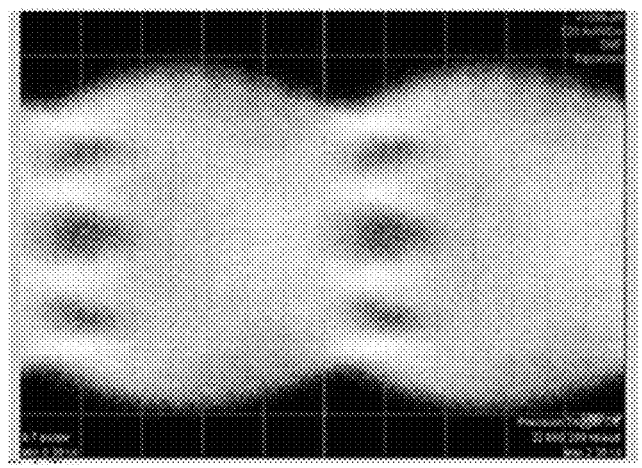
FIG. 7B is a view illustrating an example of an eye pattern of the signal output from the transmission-side electrical signal processing circuit according to the embodiment of the disclosed technology.

FIG. 7A is a view illustrating an example of an eye pattern of a signal (PAM4 signal) output from one transmission-side electrical signal processing circuit 11 which is operated in a case where only one of the four transmission-side electrical signal processing circuits 11 is operated. FIG. 7B is a view illustrating an example of an eye pattern in a configuration in which the slit is not provided in the power supply wiring network 14 in a case where adjacent two of the four transmission-side electrical signal processing circuits 11 are operated.

As illustrated in FIG. 7A, in a case where only one of the four transmission-side electrical signal processing circuits 11 is operated, crosstalk does not occur, so that an excellent eye pattern is obtained. On the other hand, as illustrated in FIG. 7B, in a case where a plurality of transmission-side electrical signal processing circuits 11 is simultaneously operated, the crosstalk occurs and the eye pattern is deteriorated. The crosstalk becomes remarkable in a case where the power supply wire is shared between the lanes. In other words, in a case where it is configured that the power supply wiring network 14 common to each lane is used to supply power to the transmission-side electrical signal processing circuit 11 of each lane 60, fluctuation of the power supply voltage occurring in a certain lane easily affects a signal transmitted in another lane. In a case where the power supply wire is provided independently for each lane in order to cope with the crosstalk, the number of bumps connected to the power supply wire increases. In the optical module 1 according to this embodiment, the electrical chip 10 has a bridge structure that straddles the optical chip 20 and the module board 30, and in the electrical chip 10, the area used for joining to the module board 30 is limited. Therefore, it might be difficult to cope with the increase in the number of bumps.

According to the optical module 1 according to this embodiment, the power supply wiring network 14 includes the slit 16 obtained by separating a part of the wires forming the power supply wiring network 14 in each area corresponding to the boundary B between the lanes 60. Therefore, it is possible to suppress an effect of the fluctuation of the power supply voltage occurring in a certain lane 60 on another lane 60 (that is, crosstalk).

Figure 8:
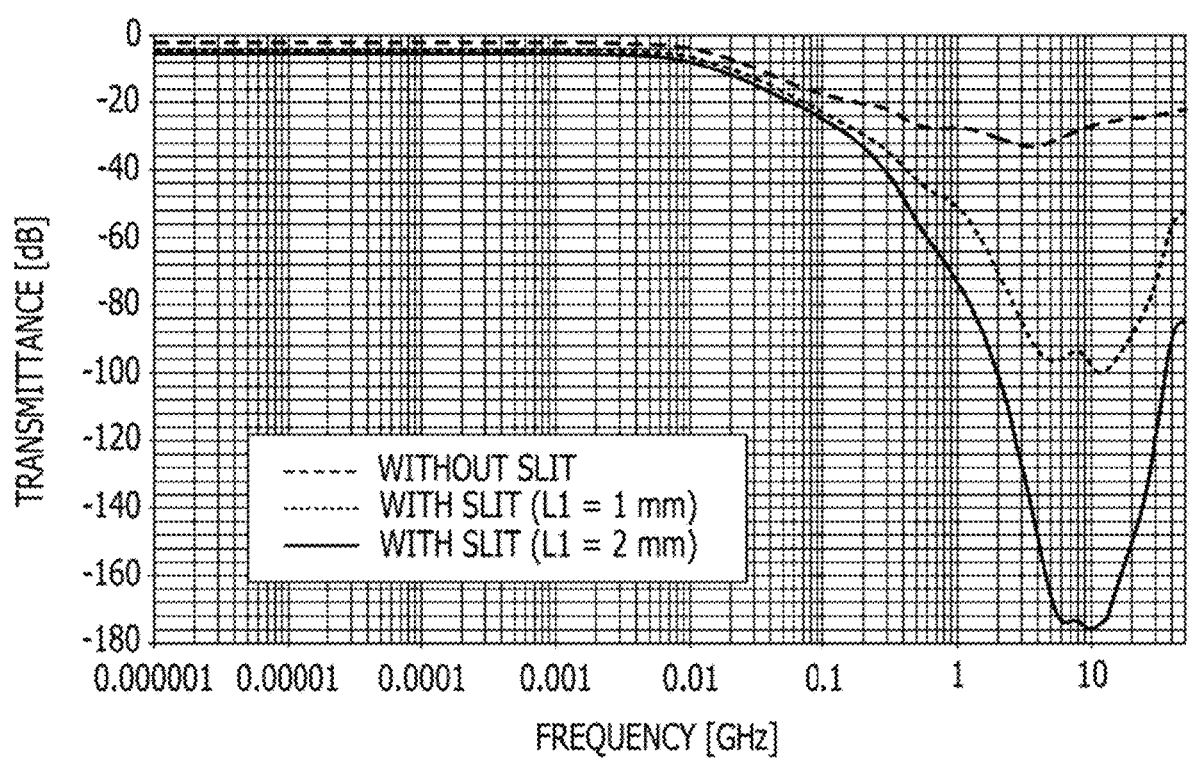
FIG. 8 is a graph illustrating a frequency characteristic of crosstalk obtained by a simulation.
Figure 9A:
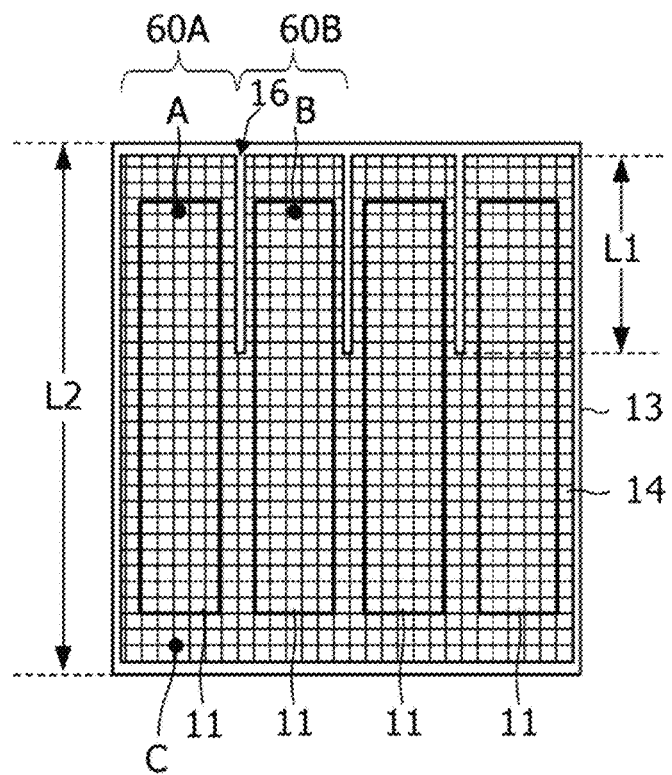
FIG. 9A is a view illustrating a simulation model of the power supply wiring network in which a length of a slit is set to about 1 mm.
Figure 9B:
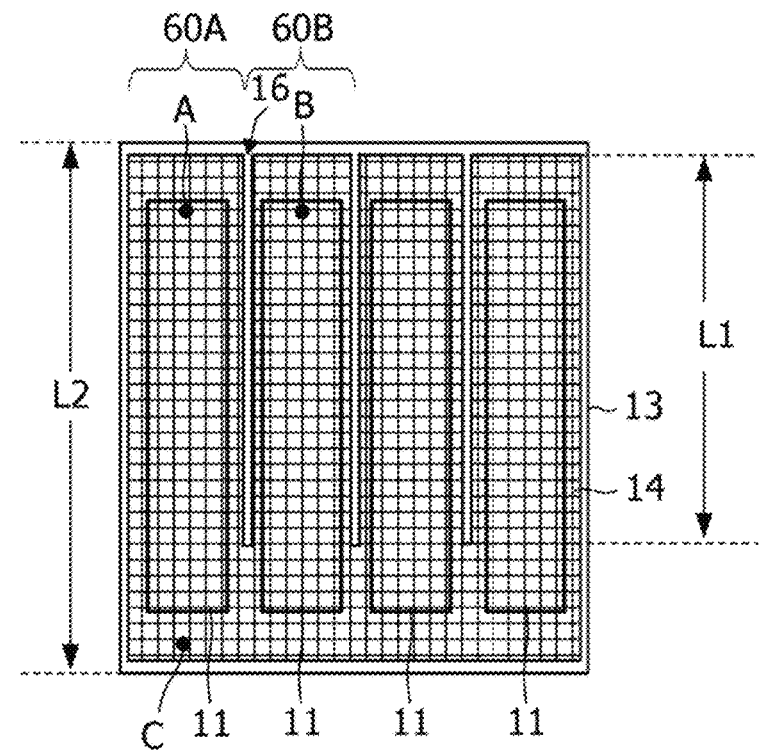
FIG. 9C is a view illustrating a simulation model of the power supply wiring network without the slit.
Figure 9C:
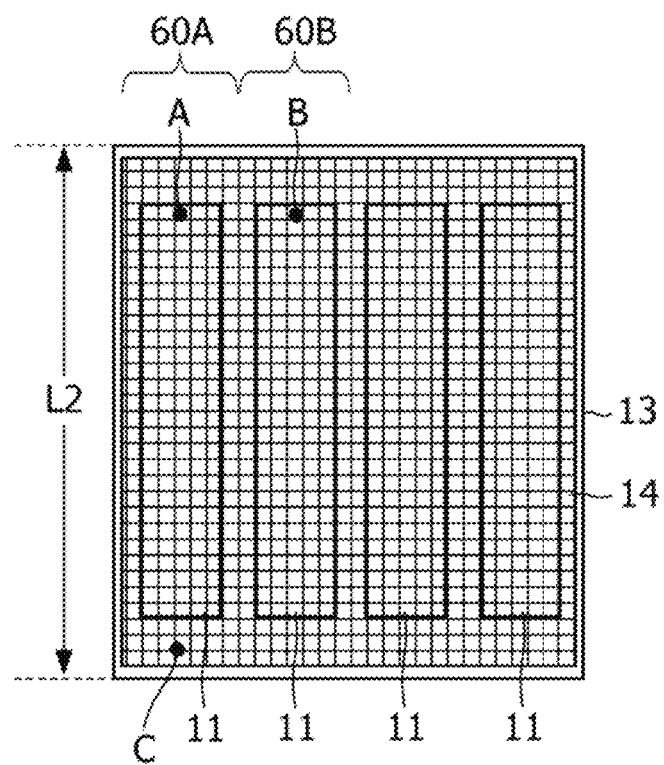

A change in frequency characteristic of the crosstalk in a case where a length of the slit 16 along the boundary B between the lanes 60 was changed was obtained by a simulation. FIG. 8 is a graph illustrating the frequency characteristic of the crosstalk obtained by the simulation. In FIG. 8, the frequency characteristics of the crosstalk in a case where a length L1 of the slit 16 is set to about 1 mm (FIG. 9A), the length L1 of the slit 16 is set to about 2 mm (FIG. 9B), and the slit 16 is not provided (FIG. 9C) are illustrated. Note that, a length L2 of the chip board 13 in an extending direction of the slit 16 is about 3 mm. Furthermore, a terminal end position of the slit 16 in a case where the length of the slit 16 is set to about 2 mm illustrated in FIG. 9B coincides with a position of an end of the module board 30.

The crosstalk was quantified by representing transmittance of a signal S2 observed at a point B in a lane 60B with respect to a signal S1 observed at a point A in a lane 60A in decibel in a case where only the transmission-side electrical signal processing circuit 11 provided on the lane 60A is operated. In other words, this means that the smaller the transmittance of the signal S2 with respect to the signal S1 (the larger the attenuation rate), the more the crosstalk is suppressed.

The transmittance at 14 GHz in a case where the slit 16 is not provided was −25.6 [dB]. The transmittance at 14 GHz in a case where the length L1 of the slit 16 was set to 1 mm was −97.6 [dB]. The transmittance at 14 GHz in a case where the length L1 of the slit 16 was set to 2 mm was −169.0 [dB]. In this manner, by providing the slit 16 obtained by separating a part of the wires forming the power supply wiring network 14 in each area corresponding to the boundary B between the lanes 60, it becomes possible to suppress the crosstalk. Furthermore, by increasing the length L of the slit 16, it is possible to enhance an effect of suppressing the crosstalk.

On the other hand, it is supposed that as the length L1 of the slit 16 increases, a resistance value of the power supply wiring network 14 in each lane 60 increases and the voltage drop increases. Therefore, a change in the resistance value of the power supply wiring network 14 in a case where the length of the slit 16 along the boundary B between the lanes 60 was changed was obtained by a simulation.

The resistance value of the power supply wiring network 14 between points A and C in a case where the slit 16 was not provided was 0.888Ω. The resistance value of the power supply wiring network 14 between the points A and C in a case where the length L1 of the slit 16 was set to 1 mm was 1.089Ω. The resistance value of the power supply wiring network 14 between the points A and C in a case where the length L1 of the slit 16 was set to 2 mm was 1.2840Ω. In this manner, as the length L1 of the slit 16 increases, the resistance value of the power supply wiring network 14 in each lane 60 increases and the voltage drop increases. In other words, since there is a trade-off relationship between suppression of the crosstalk and the voltage drop, it is preferable to set the length L1 of the slit 16 so as to suppress the crosstalk in a range in which the voltage drop does not cause a problem.

As described above, according to the optical module 1 according to the embodiment of the disclosed technology, it becomes possible to suppress the crosstalk between the lanes in a case where the power supply wire is shared between the lanes.

In the above description, the slit 16 starting from the end on the optical chip 20 side of the power supply wiring network 14 is described as an example, but the arrangement of the slit 16 on the boundary B between the lanes 60 (positions of a starting point and an ending point of the slit 16) may be changed appropriately. The slit 16 is preferably arranged especially in the vicinity of a circuit block that consumes a relatively large amount of power out of circuit blocks that form the transmission-side electrical signal processing circuits 11.

Figure 10:
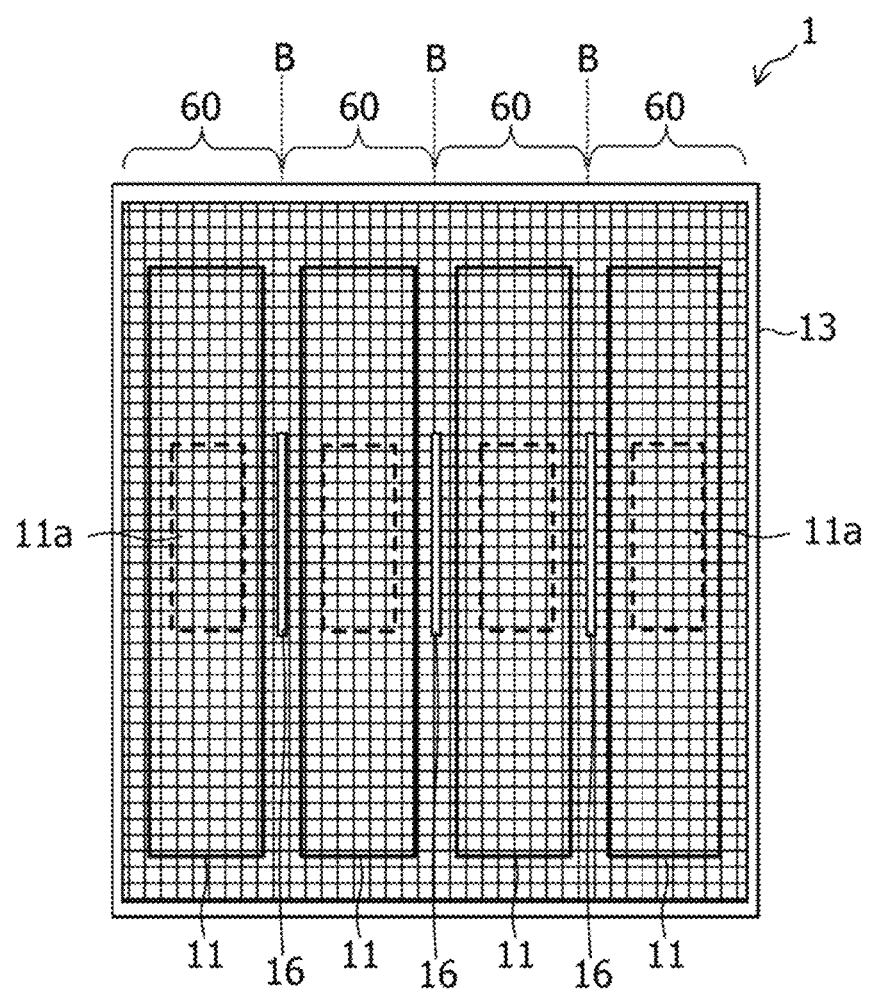
FIG. 10 is a plan view illustrating an example of a configuration in a case where a slit 16 is arranged in the vicinity of a circuit block 11a that consumes a relatively large amount of power.

FIG. 10 is a plan view illustrating an example of a configuration in which the slit 16 is arranged in the vicinity of a circuit block 11a that consumes a relatively large amount of power. In a case where the slit 16 is arranged in the vicinity of the circuit block 11a that consumes a relatively large amount of power, the positions of the starting point and ending point of the slit 16 might be located in positions away from the end of the power supply wiring network 14 on the boundary B between the lanes 60. By arranging the slit 16 in the vicinity of the circuit block 11a that consumes a relatively large amount of power, it is possible to further enhance the effect of suppressing the crosstalk.

Note that the optical module 1 is an example of an optical module in the disclosed technology. The electrical chip 10 is an example of an electrical chip in the disclosed technology. The optical chip 20 is an example of an optical chip in the disclosed technology. The module board 30 is an example of a module board in the disclosed technology. The transmission-side electrical signal processing circuit 11 is an example of an electrical signal processing circuit in the disclosed technology. The power supply wiring network 14 is an example of a power supply wiring network in the disclosed technology. The slit 16 is an example of a slit in the disclosed technology. The wire 14A is an example of a first wire in the disclosed technology. The wire 146 is an example of a second wire in the disclosed technology. The wiring layer M9 is an example of a first wiring layer in the disclosed technology. The wiring layer M10 is an example of a second wiring layer in the disclosed technology.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. An electrical chip comprising:
   a plurality of electrical signal processing circuits arranged side by side on a chip board, the electrical signal processing circuits that processes electrical signals transmitted to each of a plurality of lanes for each lane; and
   a power supply wiring network provided in an area overlapping with each of the plurality of electrical signal processing circuits and including wires formed into a mesh shape for supplying power to each of the plurality of electrical signal processing circuits,
   wherein the power supply wiring network includes a slit obtained by separating a part of the wires in each area corresponding to a boundary between the lanes.

2. The electrical chip according to claim 1,
   wherein the power supply wiring network includes:
   a plurality of first wires parallel to each other provided in a first wiring layer and extending in a direction in which the plurality of electrical signal processing circuits is arranged; and
   a plurality of second wires parallel to each other provided in a second wiring layer stacked on the first wiring layer and extending in a direction orthogonal to the direction in which the plurality of electrical signal processing circuits is arranged, and
   wherein the slit is formed of a portion in which a part of the plurality of first wires is separated.

3. The electrical chip according to claim 2,
   wherein either a power supply potential or a ground potential is applied to the first wires and the second wires, and
   out of the first wires and the second wires, wires to which the same potential is applied are connected to each other via a via at an intersection of the wires.

4. The electrical chip according to claim 1,
   wherein the slit is arranged in an area corresponding to a portion in which a power consumption amount is relatively large in the electrical signal processing circuit.

5. An optical module comprising:
   an electrical chip that processes an electrical signal; and
   an optical chip that processes an optical signal corresponding to the electrical signal,
   wherein the electrical chip includes:
   a plurality of electrical signal processing circuits arranged side by side on a chip board, the electrical signal processing circuits that processes electrical signals transmitted to each of a plurality of lanes for each lane; and
   a power supply wiring network provided in an area overlapping with each of the plurality of electrical signal processing circuits and including wires formed into a mesh shape for supplying power to each of the plurality of electrical signal processing circuits, and
   wherein the power supply wiring network includes a slit obtained by separating a part of the wires in each area corresponding to a boundary between the lanes.

6. The optical module according to claim 5, further comprising:

a module board including an opening,
wherein the optical chip is accommodated in the opening,
the electrical chip is connected to the module board in a state of protruding to the opening, and
a portion of the electrical chip protruding to the opening is connected to the optical chip.

* * * * *